(12) United States Patent
Fukui

(10) Patent No.: US 7,592,383 B2
(45) Date of Patent: Sep. 22, 2009

(54) HEAT CONDUCTIVE SILICONE COMPOSITION

(75) Inventor: Hiroshi Fukui, Chiba (JP)

(73) Assignee: Dow Corning Toray Company, Ltd., Tokyo (JP)

( * ) Notice: Subject to any disclaimer, the term of this patent is extended or adjusted under 35 U.S.C. 154(b) by 207 days.

(21) Appl. No.: 10/533,849

(22) PCT Filed: Oct. 28, 2003

(86) PCT No.: PCT/JP03/13801

§ 371 (c)(1),
(2), (4) Date: Oct. 24, 2005

(87) PCT Pub. No.: WO2004/041938

PCT Pub. Date: May 21, 2004

(65) Prior Publication Data

US 2006/0100336 A1    May 11, 2006

(30) Foreign Application Priority Data

Nov. 8, 2002  (JP) .............................. 2002-325895

(51) Int. Cl.
C08K 3/34 (2006.01)
C08L 83/05 (2006.01)
C08L 83/07 (2006.01)

(52) U.S. Cl. ................... 524/261; 524/430; 524/588

(58) Field of Classification Search ................ 524/430, 524/80, 700; 523/220
See application file for complete search history.

(56) References Cited

U.S. PATENT DOCUMENTS

| | | | |
|---|---|---|---|
| 3,045,132 A * | 7/1962 | Yeoman ...................... 310/43 |
| 3,885,984 A | 5/1975 | Wright | |
| 4,269,757 A * | 5/1981 | Mine et al. ................... 524/588 |
| 5,011,870 A * | 4/1991 | Peterson ..................... 523/220 |
| 5,100,568 A | 3/1992 | Takahashi et al. | |
| 5,221,339 A | 6/1993 | Takahashi et al. | |
| 5,256,480 A * | 10/1993 | Inoue et al. .................. 428/331 |
| 5,872,170 A * | 2/1999 | Mine et al. ................... 524/440 |
| 5,932,145 A * | 8/1999 | Mitani et al. ................. 252/511 |
| 6,025,435 A * | 2/2000 | Yamakawa et al. .......... 524/862 |
| 6,040,362 A * | 3/2000 | Mine et al. ................... 523/212 |
| 6,306,957 B1* | 10/2001 | Nakano et al. .............. 524/700 |
| 6,361,716 B1* | 3/2002 | Kleyer et al. ................ 252/514 |
| 6,380,301 B1* | 4/2002 | Enami et al. ................. 524/588 |
| 6,433,057 B1* | 8/2002 | Bhagwagar et al. ......... 524/403 |
| 6,790,533 B2* | 9/2004 | Reitmeier et al. ........... 428/447 |
| 6,844,393 B2* | 1/2005 | Goto et al. ................... 524/588 |
| 2004/0254275 A1* | 12/2004 | Fukui et al. ................. 524/261 |

FOREIGN PATENT DOCUMENTS

| | | |
|---|---|---|
| EP | 0 983 392 | 4/1999 |
| EP | 1 101 798 | 5/2001 |
| EP | 1 203 785 | 3/2004 |
| JP | 50-105573 | 8/1975 |
| JP | 61-157587 | 7/1986 |
| JP | 2000-256558 | 9/2000 |
| JP | 2001-139815 | 5/2001 |
| WO | WO 03/057782 | 7/2003 |

OTHER PUBLICATIONS

English language Abstract for JP 61-157587 extracted from espacenet.com database dated May 3, 2005.

* cited by examiner

Primary Examiner—Randy Gulakowski
Assistant Examiner—Robert Loewe

(57) ABSTRACT

A heat conductive silicone composition contains (A) a silicone oil as the primary ingredient and (B) a heat conductive filler. Component (A) has silicon-bonded alkoxy, alkoxyalkoxy, alkenoxy, or acyloxy groups in the molecule. Component (B) is surface treated with component (A).

5 Claims, No Drawings

HEAT CONDUCTIVE SILICONE COMPOSITION

TECHNICAL FIELD

This invention relates to a heat conductive silicone composition. More specifically, this invention relates to a heat conductive silicone composition possessing excellent handling properties despite containing a large amount of heat conductive filler used to obtain a highly heat conductive silicone composition.

BACKGROUND ART

In recent years, following an increase in the degree of density and integration of hybrid ICs and printed circuit boards carrying transistors, ICs, memory elements, and other electronic components, various heat conductive silicone compositions have been used to provide high-efficiency heat dissipation for them. Heat conductive silicone greases, heat conductive silicone gel compositions, and heat conductive silicone rubber compositions are known as such heat conductive silicone compositions.

Examples of such heat conductive silicone compositions include heat conductive silicone compositions utilizing a silicone oil as the primary ingredient and containing inorganic fillers such as zinc oxides and alumina powders (see Japanese Unexamined Patent Application Publication No. Sho 50-105573, Japanese Unexamined Patent Application Publication No. Sho 51-55870, and Japanese Unexamined Patent Application Publication No. Sho 61-157587), heat conductive silicone compositions comprising organopolysiloxanes, organopolysiloxanes having acyloxy groups or alkoxy groups attached to silicon atoms, heat conductive fillers, and curing agents (Japanese Unexamined Patent Application Publication No. 2000-256558), and heat conductive silicone compositions containing organopolysiloxanes, curing agents, and heat conductive fillers surface-treated with silalkylene oligosiloxanes with silicon-bonded alkoxy groups (Japanese Unexamined Patent Application Publication No. 2001-139815).

The problem with such heat conductive silicone compositions, however, is that attempts to increase the amount of fillers in the compositions causes the viscosity of the resultant compositions to rapidly rise and their handling properties drastically deteriorate.

It is an object of the present invention to provide a heat conductive silicone composition possessing excellent handling properties despite containing a large amount of heat conductive filler.

DISCLOSURE OF INVENTION

The present invention relates to a heat conductive silicone composition comprising (A) a silicone oil as the primary ingredient and (B) a heat conductive filler. Component (A) is a silicone oil selected from the group consisting of silicone oils described by a general formula $(A_1)$; silicone oils described by a general formula $(A_2)$; formula $(A_3)$; mixtures of at least two of formulae $(A_1)$, $(A_2)$, and $(A_3)$; and hydrosilylation reaction mixtures of formula $(A_1)$ and formula $(A_3)$, where the formula $(A_1)$ is $[R^1_a R^2_{(3-a)}SiO(R^1_b R^2_{(2-b)}SiO)_m (R^2_2SiO)_n]_c SiR^2_{[4-(c+d)]}(OR^3)_d$, the formula $(A_2)$ is

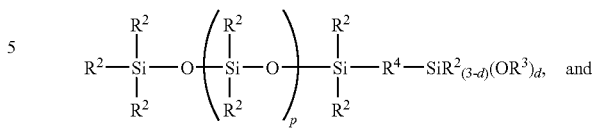

and the formula $(A_3)$ is $[H_e R^2_{(3-e)}SiO(R^2_2SiO)_n]_e SiR^2_{[4-(c+d)]}(OR^3)_d$, where all instances of $R^1$ are identical or different monovalent hydrocarbon groups with aliphatically unsaturated bonds, all instances of $R^2$ are identical or different monovalent hydrocarbon groups that do not have aliphatically unsaturated bonds, $R^3$ stands for alkyl, alkoxyalkyl, alkenyl, or acyl, "a" is an integer of 0 to 3, "b" is 1 or 2, "c" is an integer of 1 to 3, "d" is an integer of 1 to 3, "c+d" is an integer of 2 to 4, "m" is an integer of 0 or greater, "n" is an integer of 0 or greater, with the proviso that "m" is 1 or greater when "a" is 0, $R^4$ is an oxygen atom or divalent hydrocarbon group, "p" is an integer of 5 or greater, and "e" is an integer of 1 to 3.

Component (B) is surface treated with component (A).

DETAILED DESCRIPTION OF THE INVENTION

Component (A) is a silicone oil selected from the group consisting of silicone oils described by the general formula $(A_1)$, silicone oils described by the general formula $(A_2)$, silicone oils described by the general formula $(A_3)$, mixtures of at least two of components $(A_1)$ to $(A_3)$, and hydrosilylation reaction mixtures of component $(A_1)$ and component $(A_3)$. There are no particular limitations concerning a viscosity of component (A) so long as it is liquid, with its viscosity at 25° C. being preferably 5 mPa·s to 100,000 mPa·s, and especially preferably 10 mPa·s to 100,000 mPa·s. This is because component (A) easily evaporates if its viscosity at 25° C. is below the lower limit of the above-mentioned range, and the handling properties and flowability of the resultant silicone composition tend to deteriorate if viscosity exceeds the upper limit of the above-mentioned range.

The silicone oils of component $(A_1)$ are described by the general formula: $[R^1_a R^2_{(3-a)}SiO(R^1_b R^2_{(2-b)}SiO)_m (R^2_2SiO)_n]_c SiR^2_{[4-(c+d)]}(OR^3)_d$. In the formula, $R^1$ are identical or different aliphatically unsaturated monovalent hydrocarbon groups. The monovalent hydrocarbon groups with aliphatically unsaturated bonds are exemplified by vinyl, allyl, butenyl, hexenyl, decenyl, undecenyl, dodecenyl, tridecenyl, tetradecenyl, pentadecenyl, hexadecenyl, heptadecenyl, octadecenyl, nonadecenyl, eicosenyl, and other linear alkyl groups; isopropenyl, 2-methyl-2-propenyl, 2-methyl-10-undecenyl, and other branched alkenyl groups; vinylcyclohexyl, vinylcyclododecyl, and other cyclic alkyl groups with aliphatically unsaturated bonds; vinylphenyl and other aryl groups with aliphatically unsaturated bonds; and vinylbenzyl, vinylphenethyl, and other aralkyl groups with aliphatically unsaturated bonds. Linear alkenyl groups are preferable, and vinyl, allyl, and hexenyl are especially preferable. Although there are no limitations on the position of the aliphatically unsaturated bonds in $R^1$, positions farther from the attached silicon atoms are more preferable.

$R^2$ in the formula above are identical or different monovalent organic groups that do not have aliphatically unsaturated bonds, and are exemplified by linear alkyl groups such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl; branched alkyl groups such as isopropyl, tertiary butyl, isobutyl, 2-methylundecyl, and 1-hexylheptyl; cyclic alkyl groups such as cyclopentyl, cyclohexyl, and cyclodecyl; aryl groups such as phenyl, tolyl, and xylyl; aralkyl groups such as benzyl, phenethyl, and 2-(2,4,6-trimethylphenyl)propyl; halogenated alkyl groups such as 3,3,3-trifluoropropyl and 3-chloropropyl. The groups are preferably alkyl or aryl groups, with alkyl groups of 1 to 4 carbon atoms being more preferable, and methyl and ethyl being especially preferable.

$R^3$ in the formula above stands for alkyl, alkoxyalkyl, alkenyl, or acyl groups. The alkyl groups are exemplified by methyl, ethyl, and propyl. The alkoxyalkyl groups are exemplified by methoxyethyl, ethoxyethyl, and methoxypropyl. The alkenyl groups are exemplified by vinyl, propenyl, isopropenyl, and 1-ethyl-2-methylvinyl. The acyl groups are exemplified by acetyl and octanoyl. Preferably, $R^3$ represents alkyl groups, and especially preferably, methyl, ethyl, and propyl.

The subscript "a" is an integer of 0 to 3, preferably, 1. The subscript "b" is 1 or 2, preferably, 1. The subscript "c" is an integer of 1 to 3, preferably 1. The subscript "d" is an integer of 1 to 3, preferably 3. Here, "c+d" is an integer of 2 to 4. The subscript "m" is an integer of 0 or greater. However, when the subscript "a" is 0, the subscript "m" is an integer of 1 or greater. The subscript "m" is preferably an integer of 0 to 100, more preferably, an integer of 1 to 100, even more preferably, an integer of 5 to 100, still more preferably, an integer of 10 to 100, and especially preferably, an integer of 10 to 75. The subscript "n" is an integer of 0 or greater, preferably an integer of 0 to 100, more preferably, an integer of 1 to 100, even more preferably, an integer of 5 to 100, still more preferably, an integer of 10 to 100, and particularly preferably, an integer of 10 to 75.

Silicone oils of formula $(A_1)$ may be prepared by a process in which a silanol-terminated silicone oil described by the general formula:

$[R^1{}_a R^2{}_{(3-a)} SiO(R^1{}_b R^2{}_{(2-b)} SiO)_m (R^2{}_2 SiO)_n]H$ and an alkoxysilane compound having at least two silicon-bonded alkoxy groups per molecule are subjected to an alkoxy group exchange reaction in the presence of an acid catalyst such as acetic acid. In the silanol-terminated silicone oils $R^1$, $R^2$, "a," "b," "m", and "n" are as defined above. The alkoxysilane compounds having at least two silicon-bonded alkoxy groups per molecule are described by the general formula: $R^2{}_{(4-f)} Si(OR^3)_f$, where $R^2$ and $R^3$ are as described above. The subscript "f" is an integer of 2 to 4, preferably, 4. Dialkoxydialkylsilane compounds, such as dimethoxydimethylsilane, dimethoxydiethylsilane, diethoxydimethylsilane, and diethoxydiethylsilane; trialkoxyalkylsilane compounds, such as trimethoxymethylsilane, trimethoxyethylsilane, trimethoxypropylsilane, triethoxymethylsilane, and triethoxyethylsilane; and tetraalkoxysilane compounds, such as tetramethoxysilane, tetraethoxysilane, and tetrapropoxysilane, are examples of such alkoxysilane compounds. Acetic acid, propionic acid, and other aliphatic acids are examples of the acid catalysts.

Component $(A_1)$ is exemplified by the following silicone oils:

$(CH_2\!=\!CH)(CH_3)_2SiO[(CH_3)_2SiO]_5Si(OCH_3)_3$,
$(CH_2\!=\!CHCH_2)(CH_3)_2SiO[(CH_3)_2SiO]_5Si(OCH_3)_3$,
$(CH_2\!=\!CHCH_2CH_2CH_2CH_2)(CH_3)_2SiO[(CH_3)_2SiO]_5Si(OCH_3)_3$,
$(CH_2\!=\!CH)(CH_3)_2SiO[(CH_3)_2SiO]_7Si(OCH_3)_3$,
$(CH_2\!=\!CH)(CH_3)_2SiO[(CH_3)_2SiO]_7Si(OC_2H_5)_3$,
$(CH_2\!=\!CHCH_2)(CH_3)_2SiO[(CH_3)_2SiO]_7Si(OCH_3)_3$,
$(CH_2\!=\!CHCH_2CH_2CH_2CH_2)(CH_3)_2SiO[(CH_3)_2SiO]_7Si(OCH_3)_3$,
$(CH_2\!=\!CH)(CH_3)_2SiO[(CH_3)_2SiO]_7SiCH_3(OCH_3)_2$,
$(CH_2\!=\!CH)(CH_3)_2SiO[(CH_3)_2SiO]_{25}Si(OCH_3)_3$,
$(CH_2\!=\!CHCH_2)(CH_3)_2SiO[(CH_3)_2SiO]_{25}Si(OCH_3)_3$,
$(CH_2\!=\!CHCH_2CH_2CH_2CH_2)(CH_3)_2SiO[(CH_3)_2SiO]_{25}Si(OCH_3)_3$,
$(CH_2\!=\!CH)(CH_3)_2SiO[(CH_3)_2SiO]_{25}Si(OC_2H_5)_3$,
$(CH_2\!=\!CH)(CH_3)_2SiO[(CH_3)_2SiO]_{25}SiCH_3(OCH_3)_2$,
$(CH_2\!=\!CH)(CH_3)_2SiO[(CH_3)_2SiO]_{50}Si(OCH_3)_3$,
$(CH_2\!=\!CHCH_2)(CH_3)_2SiO[(CH_3)_2SiO]_7Si(OCH_3)_3$,
$(CH_2\!=\!CHCH_2CH_2CH_2CH_2)(CH_3)_2SiO[(CH_3)_2SiO]_{50}Si(OCH_3)_3$,
$(CH_2\!=\!CH)(CH_3)_2SiO[(CH_3)_2SiO]_{50}Si(OC_2H_5)_3$,
$(CH_2\!=\!CH)(CH_3)_2SiO[(CH_3)_2SiO]_{50}SiCH_3(OCH_3)_2$,
$(CH_3)_3SiO[(CH_2\!=\!CH)(CH_3)SiO]_1[(CH_3)_2SiO]_4Si(OCH_3)_3$,
$(CH_3)_3SiO[(CH_2\!=\!CH)_2SiO]_1[(CH_3)_2SiO]_4Si(OCH_3)_3$,
$(CH_3)_3SiO[(CH_2\!=\!CH)(CH_3)SiO]_1[(CH_3)_2SiO]_4Si(OC_2H_5)_3$,
$(CH_2\!=\!CH)(CH_3)_2SiO[(CH_2\!=\!CH)(CH_3)SiO]_1[(CH_3)_2SiO]_4Si(OCH_3)_3$,
$(CH_2\!=\!CH)(CH_3)_2SiO[(CH_2\!=\!CH)_2SiO]_1[(CH_3)_2SiO]_4Si(OCH_3)_3$,
$(CH_2\!=\!CH)(CH_3)_2SiO[(CH_2\!=\!CH)(CH_3)SiO]_1[(CH_3)_2SiO]_4Si(OC_2H_5)_3$,
$(CH_3)_3SiO[(CH_2\!=\!CHCH_2)(CH_3)SiO]_1[(CH_3)_2SiO]_4Si(OCH_3)_3$,
$(CH_3)_3SiO[(CH_2\!=\!CHCH_2)_2SiO][(CH_3)_2SiO]_4Si(OCH_3)_3$,
$(CH_2\!=\!CHCH_2)(CH_3)_2SiO[(CH_2\!=\!CH)(CH_3)SiO]_1[(CH_3)_2SiO]_4Si(OCH_3)_3$,
$(CH_2\!=\!CHCH_2)(CH_3)_2SiO[(CH_2\!=\!CHCH_2)(CH_3)SiO]_1[(CH_3)_2SiO]_4Si(OCH_3)_3$,
$(CH_3)_3SiO[(CH_2\!=\!CHCH_2CH_2CH_2CH_2)(CH_3)SiO]_1[(CH_3)_2SiO]_4Si(OCH_3)_3$,
$(CH_2\!=\!CHCH_2CH_2CH_2CH_2)(CH_3)_2SiO[(CH_2\!=\!CH)(CH_3)SiO]_1[(CH_3)_2SiO]_4Si(OCH_3)_3$,
$(CH_2\!=\!CHCH_2CH_2CH_2CH_2)(CH_3)_2SiO[(CH_2\!=\!CHCH_2CH_2CH_2CH_2)(CH_3)SiO]_1[(CH_3)_2SiO]_4Si(OCH_3)_3$,
$(CH_3)_3SiO[(CH_2\!=\!CH)(CH_3)SiO]_2[(CH_3)_2SiO]_1Si(OCH_3)_3$,
$(CH_3)_3SiO[(CH_2\!=\!CH)_2SiO]_2[(CH_3)_2SiO]_{10}Si(OCH_3)_3$,
$(CH_3)_3SiO[(CH_2\!=\!CH)(CH_3)SiO]_2[(CH_3)_2SiO]_{10}Si(OCH_3)_3$,
$(CH_2\!=\!CH)(CH_3)_2SiO[(CH_2\!=\!CH)(CH_3)SiO]_2[(CH_3)_2SiO]_{10}Si(OCH_3)_3$,
$(CH_2\!=\!CH)(CH_3)_2SiO[(CH_2\!=\!CH)_2SiO]_2[(CH_3)_2SiO]_{10}Si(OCH_3)_3$,
$(CH_2\!=\!CH)(CH_3)_2SiO[(CH_2\!=\!CH)(CH_3)SiO]_2[(CH_3)_2SiO]_{10}SiO(C_2H_5)_3$,
$(CH_3)_3SiO[(CH_2\!=\!CHCH_2)(CH_3)SiO]_2[(CH_3)_2SiO]_{10}Si(OCH_3)_3$,
$(CH_3)_3SiO[(CH_2\!=\!CHCH_2)_2SiO]_2[(CH_3)_2SiO]_{10}Si(OCH_3)_3$,
$(CH_2\!=\!CHCH_2)(CH_3)_2SiO[(CH_2\!=\!CH)(CH_3)SiO]_2[(CH_3)_2SiO]_{10}Si(OCH_3)_3$,
$(CH_2\!=\!CHCH_2)(CH_3)_2SiO[(CH_2\!=\!CHCH_2)(CH_3)SiO]_2[(CH_3)_2SiO]_{10}Si(OCH_3)_3$,
$(CH_3)_3SiO[(CH_2\!=\!CHCH_2CH_2CH_2CH_2)(CH_3)SiO]_2[(CH_3)_2SiO]_{10}Si(OCH_3)_3$, (CH$_2$=CHCH$_2$CH$_2$CH$_2$CH$_2$)(CH$_3$)$_2$SiO[(CH$_2$=CH)(CH$_3$)SiO]$_2$[(CH$_3$)$_2$SiO]$_{10}$Si(OCH$_3$)$_3$,
(CH$_2$=CHCH$_2$CH$_2$CH$_2$CH$_2$)(CH$_3$)$_2$SiO[(CH$_2$=CHCH$_2$CH$_2$CH$_2$CH$_2$)(CH$_3$)SiO$_2$(CH$_3$)$_2$SiO]$_{10}$Si(OCH$_3$)$_3$,
(CH$_3$)$_3$SiO[(CH$_2$=CH)(CH$_3$)SiO]$_3$[(CH$_3$)$_2$SiO]$_{22}$Si(OCH$_3$)$_3$,
(CH$_3$)$_3$SiO[(CH$_2$=CH)$_2$SiO]$_3$[(CH$_3$)$_2$SiO]$_{22}$Si(OCH$_3$)$_3$,
(CH$_3$)$_3$SiO[(CH$_2$=CH)(CH$_3$)SiO]$_3$[(CH$_3$)$_2$SiO]$_{22}$Si(OC$_2$H$_5$)$_3$,
(CH$_2$=CH)(CH$_3$)$_2$SiO[(CH$_2$=CH)(CH$_3$)SiO]$_3$ [(CH$_3$)$_2$SiO]$_{22}$Si(OCH$_3$)$_3$,
(CH$_2$=CH)(CH$_3$)$_2$SiO[(CH$_2$=CH)$_2$SiO]$_3$ [(CH$_3$)$_2$SiO]$_{22}$Si(OCH$_3$)$_3$,
(CH$_2$=CH)(CH$_3$)$_2$SiO[(CH$_2$=CH)(CH$_3$)SiO]$_3$ [(CH$_3$)$_2$SiO]$_{22}$Si(OC$_2$H$_5$)$_3$,
(CH$_3$)$_3$SiO[(CH$_2$=CHCH$_2$)(CH$_3$)SiO]$_3$[(CH$_3$)$_2$SiO]$_{22}$Si(OCH$_3$)$_3$,
(CH$_3$)$_3$SiO[(CH$_2$=CHCH$_2$)$_2$SiO]$_3$[(CH$_3$)$_2$SiO]$_{22}$Si(OCH$_3$)$_3$,
(CH$_2$=CHCH$_2$)(CH$_3$)$_2$SiO[(CH$_2$=CH)(CH$_3$)SiO]$_3$ [(CH$_3$)$_2$ SiO]$_{22}$Si(OCH$_3$)$_3$,
(CH$_2$=CHCH$_2$)(CH$_3$)$_2$SiO[(CH$_2$=CHCH$_2$)(CH$_3$)SiO]$_3$ [(CH$_3$)$_2$SiO]$_{22}$Si(OCH$_3$)$_3$,
(CH$_3$)$_3$SiO[(CH$_2$=CHCH$_2$CH$_2$CH$_2$CH$_2$)(CH$_3$)SiO]$_3$ [(CH$_3$)$_2$SiO]$_{22}$Si(OCH$_3$)$_3$,
(CH$_2$=CHCH$_2$CH$_2$CH$_2$CH$_2$)(CH$_3$)$_2$SiO[(CH$_2$=CH)(CH$_3$)SiO]$_3$[(CH$_3$)$_2$SiO]$_{22}$Si(OCH$_3$)$_3$,
(CH$_2$=CHCH$_2$CH$_2$CH$_2$CH$_2$)(CH$_3$)$_2$SiO [(CH$_2$=CHCH$_2$CH$_2$CH$_2$CH$_2$)(CH$_3$)SiO]$_3$[(CH$_3$)$_2$SiO]$_{22}$Si(OCH$_3$)$_3$,
(CH$_3$)$_3$SiO[(CH$_2$=CH)(CH$_3$)SiO]$_4$[(CH$_3$)$_2$SiO]$_{50}$Si(OCH$_3$)$_3$,
(CH$_3$)$_3$SiO[(CH$_2$=CH)$_2$SiO]$_4$[(CH$_3$)$_2$SiO]$_{50}$Si(OCH$_3$)$_3$,
(CH$_3$)$_3$SiO[(CH$_2$=CH)(CH$_3$)SiO]$_4$[(CH$_3$)$_2$SiO]$_{50}$Si(OC$_2$H$_5$)$_3$,
(CH$_2$=CH)(CH$_3$)$_2$SiO[(CH$_2$=CH)(CH$_3$)SiO]$_4$[(CH$_3$)$_2$ SiO]$_{50}$Si(OCH$_3$)$_3$,
(CH$_2$=CH)(CH$_3$)$_2$SiO[(CH$_2$=CH)$_2$SiO]$_4$[(CH$_3$)$_2$SiO]$_{50}$Si(OCH$_3$)$_3$,
(CH$_2$=CH)(CH$_3$)$_2$SiO[(CH$_2$=CH)(CH$_3$)SiO]$_4$[(CH$_3$)$_2$SiO]$_4$[(CH$_3$)$_2$SiO]$_{50}$Si(OC$_2$H$_5$)$_3$,
(CH$_3$)$_3$SiO[(CH$_2$=CHCH$_2$)(CH$_3$)SiO]$_4$[(CH$_3$)$_2$SiO]$_{50}$Si(OCH$_3$)$_3$,
(CH$_3$)$_3$SiO[(CH$_2$=CHCH$_2$)$_2$SiO]$_4$[(CH$_3$)$_2$SiO]$_{50}$Si(OCH$_3$)$_3$,
(CH$_2$=CHCH$_2$)(CH$_3$)$_2$SiO[(CH$_2$=CH)(CH$_3$)SiO]$_4$ [(CH$_3$)$_2$ SiO]$_{50}$Si(OCH$_3$)$_3$,
(CH$_2$=CHCH$_2$)(CH$_3$)$_2$SiO[(CH$_2$=CHCH$_2$)(CH$_3$)SiO]$_4$ [(CH$_3$)$_2$SiO]$_{50}$Si(OCH$_3$)$_3$,
(CH$_3$)$_3$SiO[(CH$_2$=CHCH$_2$CH$_2$CH$_2$CH$_2$)(CH$_3$)SiO]$_4$ [(CH$_3$)$_2$SiO]$_{50}$Si(OCH$_3$)$_3$, and
(CH$_2$=CHCH$_2$CH$_2$CH$_2$CH$_2$)(CH$_3$)$_2$SiO [(CH$_2$=CHCH$_2$CH$_2$CH$_2$CH$_2$)(CH$_3$)SiO]$_4$ [(CH$_3$)$_2$SiO]$_{50}$Si(OCH$_3$)$_3$.

The silicone oils of formula (A$_2$) are described by the general formula:

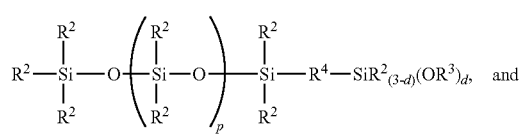

$R^2$, $R^3$, and "d" are as described above for formula (A$_1$). $R^4$ is an oxygen atom or a divalent hydrocarbon group. Methylene, ethylene, propylene, isopropylene, butylenes, and other alkylene groups; ethylenoxyethylene, ethylenoxypropylene, and other alkylenoxyalkylene groups are examples of the divalent hydrocarbon groups of $R^4$. Oxygen atoms are particularly preferable as $R^4$. The subscript "p" is an integer of 5 or greater, preferably, an integer of 5 to 200, more preferably, an integer of 10 to 180, more preferably, an integer of 15 to 150, and especially preferably, an integer of 15 to 120. If the subscript "p" is below the lower limit of the range, addition of a large amount of component (B) to obtain a heat conductive silicone composition tends to become impossible. If the subscript "p" exceeds the upper limit of the range, there is an excessive increase in the molecular volume bound by the surface of component (B) and introduction of a large amount of component (B) tends to become impossible. In particular, if the content of component (B) in the present composition is set to an extremely high value such as 80 vol % or higher, the distances between the particles of component (B) become shorter on the average and the tendency becomes more pronounced.

Examples of formula (A$_2$) include the following.

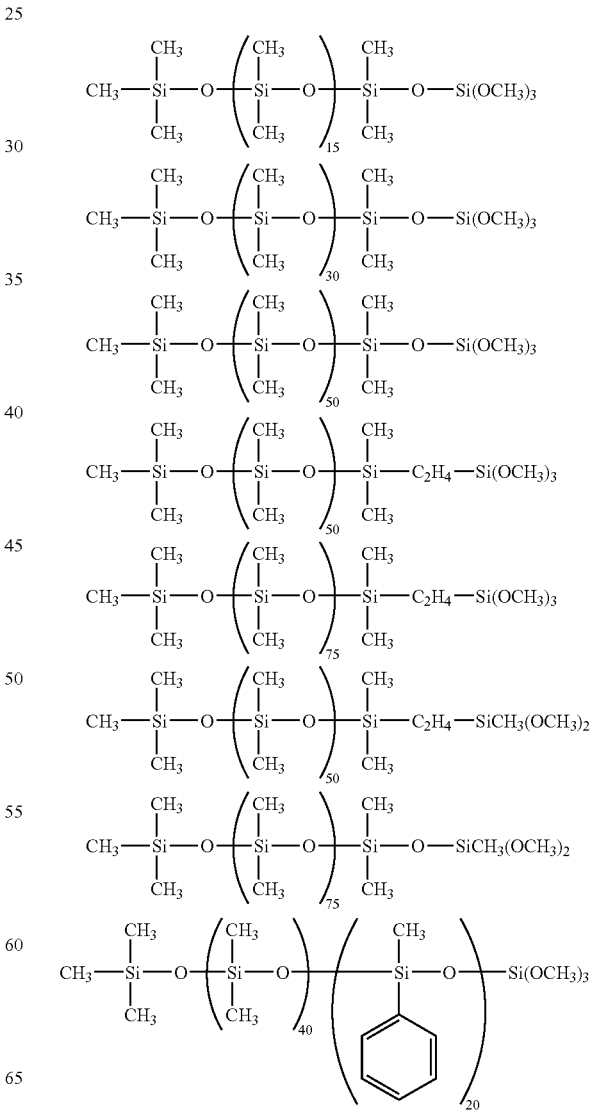

-continued

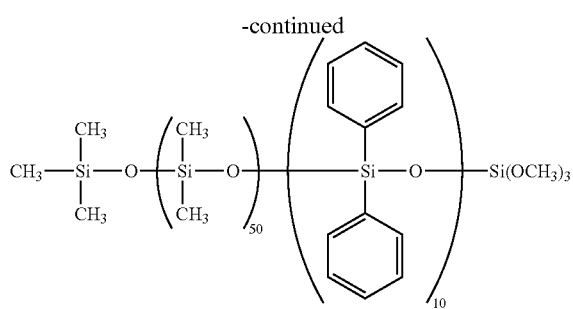

The silicone oils of formula ($A_3$) are described by the general formula $[H_eR^2_{(3-e)}SiO(R^2_2SiO)_n]_cSiR^2_{[4-(c+d)]}(OR^3)_d$. $R^2$, $R^3$, "c", "d", "c+d", and "n" in formula ($A_3$) are the same as above in formula ($A_1$). The subscript "e" is an integer of 1 to 3, preferably, 1.

An example of the methods that can be used to prepare silicone oils of formula ($A_3$) includes a process in which a silicone oil terminated with silanol groups described by the general formula: $[H_eR^2_{(3-e)}SiO(R^2_2SiO)_n]H$ and an alkoxysilane compound having at least two silicon-bonded alkoxy groups per molecule are subjected to an alkoxy group exchange reaction in the presence of an acid catalyst such as acetic acid. In the silanol-terminated silicone oil, $R^2$ and "n" are as described above. The subscript "e" is an integer of 1 to 3, preferably 1. The alkoxysilane compounds having at least two silicon-bonded alkoxy groups per molecule are described by the general formula: $R^2_{(4-f)}Si(OR^3)_f$. In the alkoxysilane compounds, $R^2$, $R^3$, and "f" are as described above. Dialkoxydialkylsilane compounds, such as dimethoxydimethylsilane, dimethoxydiethylsilane, diethoxydimethylsilane, and diethoxydiethylsilane; trialkoxydialkylsilane compounds, such as trimethoxymethylsilane, trimethoxyethylsilane, trimethoxypropylsilane, triethoxymethylsilane, and triethoxyethylsilane; tetraalkoxysilane compounds, such as tetramethoxysilane, tetraethoxysilane, and tetrapropoxysilane, are examples of such alkoxysilane compounds. Acetic acid, propionic acid, and other aliphatic acids are examples of the acid catalysts.

Component ($A_3$) is exemplified by the following silicone oils:

$H(CH_3)_2SiO[(CH_3)_2SiO]_5Si(OCH_3)_3$,
$H(CH_3)_2SiO[(CH_3)_2SiO]_5Si(OC_2H_5)_3$,
$H(C_2H_5)_2SiO[(CH_3)_2SiO]_5Si(OCH_3)_3$,
$H(C_6H_{13})_2SiO[(CH_3)_2SiO]_5Si(OCH_3)_3$,
$H(CH_3)_2SiO[(CH_3)_2SiO]_{10}Si(OCH_3)_3$,
$H(CH_3)_2SiO[(CH_3)_2SiO]_{25}Si(OCH_3)_3$,
$H(CH_3)_2SiO[(CH_3)_2SiO]_{25}Si(OC_2H_5)_3$,
$H(C_2H_5)_2SiO[(CH_3)_2SiO]_{25}Si(OCH_3)_3$,
$H(CH_3)(C_2H_5)SiO[(CH_3)_2SiO]_{25}Si(OCH_3)_3$,
$H(C_6H_{13})_2SiO[(CH_3)_2SiO]_{25}Si(OCH_3)_3$,
$H(CH_3)_2SiO[(CH_3)_2SiO]_{50}Si(OCH_3)_3$,
$H(CH_3)_2SiO[(CH_3)_2SiO]_{50}Si(OC_2H_5)_3$,
$H(C_2H_5)_2SiO[(CH_3)_2SiO]_{50}Si(OCH_3)_3$,
$H(CH_3)_2SiO[(CH_3)_2SiO]_{75}Si(OCH_3)_3$,
$H(CH_3)_2SiO[(CH_3)_2SiO]_{100}Si(OCH_3)_3$,
$H(CH_3)(C_2H_5)SiO[(CH_3)_2SiO]_{100}Si(OCH_3)_3$,
$H(C_2H_5)_2SiO[(CH_3)_2SiO]_{100}Si(OC_2H_5)_3$,
$H(C_6H_{13})_2SiO[(CH_3)_2SiO]_{100}Si(OCH_3)_3$, and
$H(CH_3)_2SiO[(CH_3)_2SiO]_{120}Si(OCH_3)_3$.

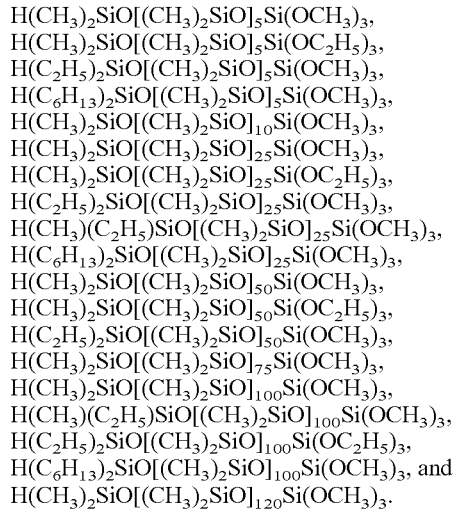

Component (B) is a heat conductive filler used to impart thermal conductivity to the present composition. Component (B) is characterized in that it is surface treated with component (A). Aluminum powder, copper powder, nickel powder, and other metal powders; alumina powder, magnesium oxide powder, beryllium oxide powder, titanium oxide powder, and other metal oxide powders; boron nitride powder, aluminum nitride powder, and other metal nitride powders; boron carbide powder, titanium carbide powder, silicon carbide powder, and other metal carbide powders; powders of soft magnetic alloys, such as Fe—Si alloys, Fe—Al alloys, Fe—Si—Al alloys, Fe—Si—Cr alloys, Fe—Ni alloys, Fe—Ni—Co alloys, Fe—Ni—Mo alloys, Fe—Co alloys, Fe—Si—Al—Cr alloys, Fe—Si—B alloys, Fe—Si—Co—B alloys, etc.; Mn—Zn ferrite, Mn—Mg—Zn ferrite, Mg—Cu—Zn ferrite, Mg—Cu—Zn ferrite, Ni—Zn ferrite, Ni—Cu—Zn ferrite, Cu—Zn ferrite and other ferrites, or mixtures of two or more of the above-mentioned materials are suggested as examples of such heat conductive fillers for component (B).

The shape of component (B) may be, inter alia, quasi-spherical, needle-like, disc-like, rod-like, oblate, or irregular. When electrical insulation properties are required of the present composition, component (B) is preferably a metal oxide powder, metal nitride powder, metal carbide powder, and especially preferably, an alumina powder. There are no limitations concerning the average particle size of component (B), which is preferably 0.1 to 100 μm, and especially preferably 0.1 to 50 μm. Additionally, component (B) is preferably ($B_1$) a quasi-spherical alumina powder with an average particle size of 0.1 to 20 μm or ($B_2$) a mixture of ($B_{21}$) a quasi-spherical alumina powder with an average particle size of 5 to 50 μm (excluding 5 μm) and ($B_{22}$) a quasi-spherical or irregular-shaped alumina powder with an average particle size of 0.1 to 5 μm. In component ($B_2$), the content of component ($B_{21}$) is 30 to 90 wt % and the content of component ($B_{22}$) is 10 to 70 wt %.

Although there are no limitations on the content of component (B) in the present composition, in order to form a silicone composition of excellent thermal conductivity, the content of component (B) should preferably be at least 30 vol %, more preferably 30 to 90 vol %, even more preferably 60 to 90 vol %, and especially preferably 80 to 90 vol %. Similarly, to form a silicone composition of excellent thermal conductivity, the content of component (B) in the present composition should preferably be at least 50 wt %, more preferably 70 to 98 wt %, and especially preferably 90 to 97 wt %. Specifically, the content of component (B) should preferably be 500 to 3,500 parts by weight, more preferably 500 to 2,500 parts by weight, and especially preferably 800 to 2,500 parts by weight, per 100 parts by weight of component (A). This is due to the fact that when the content of component (B) is below the lower limit of the above-mentioned range, the thermal conductivity of the resultant silicone composition tends to be insufficient, and when it exceeds the upper limit of the above-mentioned range, the viscosity of the resultant composition becomes exceedingly high, component (B) cannot be uniformly dispersed in the resultant silicone composition, and the handling properties of the composition tend to drastically deteriorate.

To obtain a heat conductive silicone composition possessing excellent handling properties despite containing a large amount of component (B), silane compounds described by the general formula: $R^4_{(4-g)}Si(OR^3)_g$, where $R^4$ is a monovalent hydrocarbon group, $R^3$ is as described above, and the subscript "g" is an integer of 1 to 3, preferably 2 or 3, can be added to the present composition. In the silane compounds, $R^4$ in the formula is a monovalent hydrocarbon group exemplified by the above-mentioned monovalent hydrocarbon groups that do not have aliphatically unsaturated bonds and by the above-mentioned monovalent hydrocarbon groups that have aliphatically unsaturated bonds. Such silane compounds are exemplified by alkoxysilanes, such as methyltrimethoxysilane, dimethyldimethoxysilane, ethyltrimethoxysilane, octyltrimethoxysilane, nonyltrimethoxysilane, decyltrimethoxysilane, vinyltrimethoxysilane, phenyltrimetoxysilane, and methyltriethoxysilane; alkoxyalkoxysilanes, such as methyltri(methoxyethoxy)silane; alkenoxysilanes, such as methyltriisopropenoxysilane; and acyloxysilanes, such as methyltriacetoxysilane.

The content of the above-mentioned silane compound in the present composition is an amount capable of improving the dispersibility in the resultant heat conductive silicone composition. The amount is preferably 0.001 to 10 parts by weight, and especially preferably 0.001 to 5 parts by weight, per 100 parts by weight of component (B). When the content of the above-mentioned silane compounds is below the lower limit of the above-mentioned range, component (B) precipitates and separates, and the consistency of the resultant silicone composition undergoes significant degradation in storage when it is combined with a large amount of component (B). When the content of the silane compounds exceeds the upper limit of the above-mentioned range, the physical characteristics of the resultant silicone composition tend to deteriorate.

In case of using the above-mentioned silane compounds, there are no limitations on the processes used to prepare the present composition. Examples of such processes include: (1) the composition is prepared by adding the above-mentioned silane compounds to component (A), and then mixing component (B) with them; (2) the composition is prepared by mixing component (A) and component (B), and then mixing the above-mentioned silane compounds with them; and (3) the composition is prepared by mixing the above-mentioned silane compounds and component (B), and then mixing component (A) with them, with process (1) being especially preferable. In such a composition, component (A) or component (A) and the above-mentioned silane compounds may be applied to the surface of component (B). In addition, when component (B) is surface treated with component (A) or with component (A) and the above-mentioned silane compounds, to speed up the treatment, they may be heated or combined with acetic acid, phosphoric acid, and other acidic substances, as well as with trialkylamine, quaternary ammonium salts, ammonia gas, ammonium carbonate, and other basic substances.

When component (A) is a silicone oil selected from the group silicone oils described by the general formula ($A_1$) and silicone oils described by the general formula ($A_3$), and the composition further comprises (C) a component increasing the viscosity of the above-mentioned component (A) via a hydrosilylation reaction, then component (C) does not contain silicone oils corresponding to component (A).

When component (A) has formula ($A_1$), component (C) preferably comprises a silicone oil having at least one silicon-bonded hydrogen atom per molecule (excluding silicone oils having formula ($A_3$)) and a platinum catalyst. When component (A) has formula ($A_3$), component (C) preferably comprises a silicone oil having at least one monovalent hydrocarbon group having aliphatically unsaturated bonds attached to silicon atoms per molecule (excluding silicone oils having formula ($A_1$)) and a platinum catalyst.

In the silicone oil of component (C) having at least one silicon-bonded hydrogen atom per molecule, groups bonded to silicon atom (other than hydrogen atoms) are exemplified by monovalent hydrocarbon groups that do not have aliphatically unsaturated bonds, preferably, alkyl and aryl groups, more preferably alkyl groups of 1 to 4 carbon atoms, and especially preferably, methyl and ethyl. Although there are no limitations on the viscosity of the silicone oils at 25° C., the viscosity is preferably 1 to 100,000 mPa·s, and especially preferably 1 to 5,000 mPa·s. There are no limitations on the molecular structure of the silicone oils, with linear, branched, partially branched linear, cyclic, and dendritic (dendrimer) structures suggested as examples. Homopolymers having the above-mentioned molecular structures, copolymers having these molecular structures, or their mixtures are suggested as examples of the silicone oils.

Dimethylpolysiloxanes having both ends of the molecular chain blocked by dimethylhydrogensiloxy groups, copolymers of methylhydrogensiloxane and dimethylsiloxane having both ends of the molecular chain blocked by trimethylsiloxy groups, copolymers of methylhydrogensiloxane and dimethylsiloxane having both ends of the molecular chain blocked by dimethylhydrogensiloxy groups, organosiloxane copolymer consisting of siloxane units represented by the formulae: $(CH_3)SiO_{1/2}$, $(CH_3)_2HSiO_{1/2}$, and $SiO_{4/2}$, as well as mixtures of two or more of the above, are suggested as specific examples of such silicone oils.

The content of the silicone oils in the present composition is an amount sufficient to increase the viscosity of component ($A_1$). The amount is preferably such that the quantity of silicon-bonded hydrogen atoms is 0.1 to 10 mol, more preferably 0.1 to 5 mol, and especially preferably 0.1 to 3.0 moL, per 1 mol of the monovalent hydrocarbon groups with aliphatically unsaturated bonds attached to silicon atoms in component ($A_1$). This is due to the fact that when the content of this component is an amount that is below the lower limit of the above-mentioned range, sufficiently increasing the viscosity of component ($A_1$) tends to become impossible, and sufficiently increasing the viscosity of component ($A_1$) tends to become impossible when it exceeds the upper limit of the above-mentioned range.

In addition, in the silicone oil of component (C) having at least one monovalent hydrocarbon group with aliphatically unsaturated bonds attached to silicon atoms per molecule, the monovalent hydrocarbon groups with aliphatically unsaturated bonds are exemplified by the same groups as those mentioned above, preferably, linear alkenyl groups, and especially preferably, vinyl, allyl, or hexenyl. Additionally, groups bonded to silicon atoms (other than the monovalent hydrocarbon groups with aliphatically unsaturated bonds) are exemplified by monovalent hydrocarbon groups that do not have the above-mentioned aliphatically unsaturated bonds, preferably, alkyl and aryl groups, more preferably alkyl groups of 1 to 4 carbon atoms, and especially preferably, methyl and ethyl. Although there are no limitations on the viscosity of the silicone oils at 25° C., the viscosity is preferably 20 to 100,000 mPa·s, more preferably 50 to 100,000 mPa·s, still more preferably 50 to 50,000 mPa·s, and especially preferably 100 to 50,000 mPa·s. There are no limitations on the molecular structure of the silicone oils, with linear, branched, partially branched linear, cyclic, and dendritic (dendrimer) structures suggested as examples. Homopolymers having these molecular structures, copolymers having these molecular structures, or their mixtures are suggested as examples of the silicone oils.

Dimethylpolysiloxane having both ends of the molecular chain blocked by dimethylvinylsiloxy groups, dimethylpolysiloxane having both ends of the molecular chain blocked by methylphenylvinylsiloxy groups, copolymer of methylphenylsiloxane and dimethylsiloxane having both ends of the molecular chain blocked by dimethylvinylsiloxy groups, copolymer of methylvinylsiloxane and dimethylsiloxane having both ends of the molecular chain blocked by dimethylvinylsiloxy groups, copolymer of methylvinylsiloxane and dimethylsiloxane having both ends of the molecular chain blocked by trimethylsiloxy groups, methyl(3,3,3-trifluoropropyl)polysiloxane having both ends of the molecular chain blocked by dimethylvinylsiloxy groups, copolymer of methylvinylsiloxane and dimethylsiloxane having both ends of the molecular chain blocked by silanol groups, copolymer of methylphenylsiloxane, methylvinylsiloxane, and dimethylsiloxane having both ends of the molecular chain blocked by silanol groups, organosiloxane copolymer consisting of siloxane units represented by the formula: $(CH_3)_3SiO_{1/2}$, siloxane units represented by the formula: $(CH_3)_2(CH_2=CH)SiO_{1/2}$, siloxane units represented by the formula: $CH_3SiO_{3/2}$, and siloxane units represented by the formula: $(CH_3)_2SiO_{2/2}$, dimethylpolysiloxane having both ends of the molecular chain blocked by silanol groups, copolymer of methylphenylsiloxane and dimethylsiloxane having both ends of the molecular chain blocked by silanol groups, dimethylpolysiloxane having both ends of the molecular chain blocked by trimethoxysiloxy groups, copolymer of methylphenylsiloxane and dimethylsiloxane having both ends of the molecular chain blocked by trimethoxysilyl group, dimethylpolysiloxane having both ends of the molecular chain blocked by methyldimethoxysiloxy groups, dimethylpolysiloxane having both ends of the molecular chain blocked by triethoxysiloxy groups, dimethylpolysiloxane having both ends of the molecular chain blocked by trimethoxysilylethyl groups, and mixtures of two or more of the above are suggested as specific examples of such silicone oils.

The content of the silicone oils in the present composition is an amount sufficient to increase the viscosity of component ($A_3$). The amount is preferably such that the quantity of silicon-bonded hydrogen atoms in component ($A_3$) is 0.1 to 10 mol, more preferably 0.1 to 5 mol, and especially preferably 0.1 to 3.0 mol, per 1 mol of the monovalent hydrocarbon groups with aliphatically unsaturated bonds attached to silicon atoms in the present component. This is due to the fact that when the content of the present component is an amount that is below the lower limit of the above-mentioned range, sufficiently increasing the viscosity of component ($A_3$) tends to become impossible, and sufficiently increasing the viscosity of component ($A_3$) tends to become impossible when it exceeds the upper limit of the above-mentioned range.

The platinum catalyst of component (C) is a catalyst promoting an increase in the viscosity of component ($A_1$) or component ($A_3$) via a hydrosilylation reaction. Chloroplatinic acid, alcohol solutions of chloroplatinic acid, olefin complexes of platinum, alkenylsiloxane complexes of platinum, and carbonyl complexes of platinum are examples of such catalysts.

In the present composition, the content of the platinum catalyst is an amount that promotes an increase in the viscosity of component ($A_1$) or component ($A_3$) via a hydrosilylation reaction. The amount is preferably such that the concentration of platinum metal in the composition is 0.01 to 1,000 ppm, and especially preferably 0.1 to 500 ppm. When the platinum content is below the lower limit of the above-mentioned range, promoting an increase in the viscosity of component ($A_1$) or component ($A_3$) via a hydrosilylation reaction tends to become impossible, and an increase in the viscosity of component ($A_1$) or component ($A_3$) via a hydrosilylation reaction cannot be promoted to a substantial extent when the composition contains an amount exceeding the upper limit of the above-mentioned range.

Furthermore, so long as the object of the present invention is not impaired, the present composition may additionally comprise other optional components, such as fumed silica, precipitated silica, fumed titanium oxide, and other fillers, as well as fillers obtained by treating the surfaces of the above-mentioned fillers with organosilicon compounds to render the surfaces hydrophobic.

EXAMPLES

The physical properties mentioned in these examples are represented by values obtained at 25° C. The consistency and thermal conductivity of the heat conductive silicone composition were measured as follows.

Consistency Of Heat Conductive Silicone Compositions

The ¼-scale cone penetration consistency of the heat conductive silicone composition was measured in accordance with the method stipulated in JIS K2220. Large consistency values were interpreted to mean that a heat conductive silicone composition possessed considerable plasticity and superior handling properties.

Thermal conductivity of Heat Conductive Silicone Compositions

A certain amount of heat conductive silicone composition was wrapped in polyvinylidene chloride and its thermal conductivity was measured in accordance with the hot-wire method defined in JIS R2616 using the Quick Thermal Conductivity Meter QTM-500 from Kyoto Electronics Manufacturing Co., Ltd.

Example 1

A heat conductive silicone grease with an alumina powder content of 82.8 vol % was prepared by placing 5.0 parts by weight of a silicone oil represented by the formula $(CH_3)_3SiO[(CH_3)_2SiO]_{110}Si(OCH_3)_3$ with a viscosity of 125 mPa·s and 95 parts by weight of a quasi-spherical alumina powder with an average particle size of 10 μm in a mixer and mixing the components at room temperature. The ¼-scale cone penetration consistency of the heat conductive silicone grease was 110 and its thermal conductivity was 5.5 W/m·K.

Example 2

A heat conductive silicone grease with an alumina powder content of 82.8 vol % was prepared by placing 5.0 parts by weight of a silicone oil represented by the formula $(CH_2=CH)(CH_3)_2SiO[(CH_3)_2SiO]_{29}Si(OCH_3)_3$ with a viscosity of 24 mPa·s and 95 parts by weight of a quasi-spherical alumina powder with an average particle size of 10 μm in a mixer and mixing the components at room temperature. The ¼-scale cone penetration consistency of the heat conductive silicone grease was 135 and its thermal conductivity was 5.5 W/m·K.

Example 3

A heat conductive silicone grease with an alumina powder content of 82.8 vol % was prepared by placing 5.0 parts by weight of a silicone oil represented by the formula $(CH_3)_3SiO[(CH_3)_2SiO]_{88}Si(OCH_3)_3$ with a viscosity of 85 mPa·s and 95 parts by weight of a quasi-spherical alumina powder with an average particle size of 10 μm in a mixer and mixing the components at room temperature. The ¼-scale cone penetration consistency of the heat conductive silicone grease was 130 and its thermal conductivity was 5.5 W/m·K.

Example 4

A heat conductive silicone grease with an alumina powder content of 82.8 vol % was prepared by placing 5.0 parts by weight of a silicone oil represented by the formula $(CH_3)_3SiO[(CH_3)_2SiO]_{110}Si(OCH_3)_3$ with a viscosity of 125 mPa·s, 57 parts by weight of a spherical alumina powder with an average particle size of 40 µm, and 38 parts by weight of an irregular-shaped alumina powder with an average particle size of 2.2 µm in a mixer and mixing the components at room temperature. The ¼-scale cone penetration consistency of the heat conductive silicone grease was 113 and its thermal conductivity was 6.0 W/m·K.

Example 5

A heat conductive silicone grease with an alumina powder content of 82.8 vol % was prepared by placing 5.0 parts by weight of a silicone oil represented by the formula $(CH_2=CH)(CH_3)_2SiO[(CH_3)_2SiO]_{29}Si(OCH_3)_3$ with a viscosity of 24 mPa·s, 57 parts by weight of a spherical alumina powder with an average particle size of 40 µm, and 38 parts by weight of an irregular-shaped alumina powder with an average particle size of 2.2 µm in a mixer and mixing the components at room temperature. The ¼-scale cone penetration consistency of the heat conductive silicone grease was 123 and its thermal conductivity was 6.0 W/m·K.

Example 6

A heat conductive silicone grease with an alumina powder content of 82.8 vol % was prepared by placing 5.0 parts by weight of a silicone oil represented by the formula $(CH_3)_3SiO[(CH_3)_2SiO]_{115}Si(OCH_3)_3$ with a viscosity of 15 mPa·s, 57 parts by weight of a spherical alumina powder with an average particle size of 40 µm, and 38 parts by weight of an irregular-shaped alumina powder with an average particle size of 2.2 µm in a mixer and mixing the components at room temperature. The ¼-scale cone penetration consistency of the heat conductive silicone grease was 125 and its thermal conductivity was 6.0 W/m·K.

Example 7

A heat conductive silicone grease with an alumina powder content of 82.8 vol % was prepared by placing 5.0 parts by weight of a silicone oil represented by the formula $(CH_3)_3SiO[(CH_3)_2SiO]_{88}Si(OCH_3)_3$ with a viscosity of 85 mPa·s, 57 parts by weight of a spherical alumina powder with an average particle size of 40 µm, and 38 parts by weight of an irregular-shaped alumina powder with an average particle size of 2.2 µm in a mixer and mixing the components at room temperature. The ¼-scale cone penetration consistency of the heat conductive silicone grease was 112 and its thermal conductivity was 6.0 W/m·K.

Example 8

A heat conductive silicone grease with an alumina powder content of 82.8 vol % was prepared by placing 5.0 parts by weight of a silicone oil represented by the formula $(CH_3)_3SiO[(CH_3)_2SiO]_{23}Si(OCH_3)_3$ with a viscosity of 22 mPa·s, 57 parts by weight of a spherical alumina powder with an average particle size of 40 µm, and 38 parts by weight of an irregular-shaped alumina powder with an average particle size of 2.2 µm in a mixer and mixing the components at room temperature. The ¼-scale cone penetration consistency of the heat conductive silicone grease was 110 and its thermal conductivity was 6.0 W/m·K.

Example 9

A heat conductive silicone grease with an alumina powder content of 82.8 vol % was prepared by placing 5.0 parts by weight of a silicone oil represented by the formula $(CH_3)_3SiO[(CH_3)_2SiO]_{50}Si(OCH_3)_3$ with a viscosity of 49 mPa·s, 57 parts by weight of a spherical alumina powder with an average particle size of 40 µm, and 38 parts by weight of an irregular-shaped alumina powder with an average particle size of 2.2 µm in a mixer and mixing the components at room temperature. The ¼-scale cone penetration consistency of the heat conductive silicone grease was 119 and its thermal conductivity was 6.0 W/m·K.

Example 10

A heat conductive silicone grease with an alumina powder content of 82.8 vol % was prepared by placing 3.39 parts by weight of a silicone oil represented by the formula $(CH_2=CH)(CH_3)_2SiO[(CH_3)_2SiO]_{29}Si(OCH_3)_3$ with a viscosity of 24 mPa·s, 1.56 parts by weight of a silicone oil represented by the formula $H(CH_3)_2SiO[(CH_3)_2SiO]_{25}Si(OCH_3)_3$ with a viscosity of 24 mPa·s, and 95 parts by weight of a quasi-spherical alumina powder with an average particle size of 10 µm in a mixer and mixing the components at room temperature. The ¼-scale cone penetration consistency of the heat conductive silicone grease was 123 and its thermal conductivity was 5.5 W/m·K.

Example 11

A heat conductive silicone composition was prepared by mixing 0.05 parts by weight of a 1,3-divinyltetramethyldisiloxane complex of platinum with a platinum content of 0.5 wt % with the heat conductive silicone grease prepared in Example 10. A heat conductive silicone grease was prepared by subjecting the composition to a hydrosilylation reaction by heating it at 80° C. for 15 minutes. The ¼-scale cone penetration consistency of the heat conductive silicone grease was 75 and its thermal conductivity was 5.5 W/m·K.

Example 12

A heat conductive silicone grease with an alumina powder content of 82.8 vol % was prepared by placing 4.2 parts by weight of a silicone oil represented by the formula $(CH_2=CH)(CH_3)_2SiO[(CH_3)_2SiO]_{29}Si(OCH_3)_3$ with a viscosity of 24 mPa·s, 0.75 parts by weight of a copolymer of methylhydrogensiloxane and dimethylsiloxane having both ends of the molecular chain blocked by dimethylhydrogensiloxy groups and a viscosity of 15 mPa·s (content of silicon-bonded hydrogen atoms=0.13 wt %), and 95 parts by weight of a quasi-spherical alumina powder with an average particle size of 10 µm in a mixer and mixing the components at room temperature. The ¼-scale cone penetration consistency of the heat conductive silicone grease was 128 and its thermal conductivity was 6.0 W/m·K.

Example 13

A heat conductive silicone composition was prepared by mixing 0.05 parts by weight of a 1,3-divinyltetramethyldisiloxane complex of platinum with a platinum content of 0.5 wt % with the heat conductive silicone grease prepared in Example 12. A heat conductive silicone grease was prepared by subjecting the composition to a hydrosilylation reaction by heating it at 80° C. for 15 minutes. The ¼-scale cone penetration consistency of the heat conductive silicone grease was 67 and its thermal conductivity was 6.0 W/m·K.

Example 14

A heat conductive silicone grease with an alumina powder content of 82.8 vol % was prepared by placing 2.5 parts by weight of a silicone oil represented by the formula $(CH_3)_3SiO[(CH_3)_2SiO]_{88}Si(OCH_3)_3$ with a viscosity of 85 mPa·s, 2.5 parts by weight of a silicone oil represented by the formula $(CH_3)_3SiO[(CH_3)_2SiO]_{15}Si(OCH_3)_3$ with a viscosity of 15 mPa·s, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 144 and its thermal conductivity was 6.0 W/m·K.

Example 15

A heat conductive silicone grease with an alumina powder content of 82.8 vol % was prepared by placing 2.5 parts by weight of a silicone oil represented by the formula $(CH_3)_3SiO[(CH_3)_2SiO]_{110}Si(OCH_3)_3$ with a viscosity of 125 mPa·s, 2.5 parts by weight of a silicone oil represented by the formula $(CH_3)_3SiO[(CH_3)_2SiO]_{23}Si(OCH_3)_3$ with a viscosity of 22 mPa·s, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 125 and its thermal conductivity was 6.0 W/m·K.

Example 16

A heat conductive silicone grease with an alumina powder content of 82.8 vol % was prepared by placing 2.5 parts by weight of a silicone oil represented by the formula $(CH_3)_3SiO[(CH_3)_2SiO]_{110}Si(OCH_3)_3$ with a viscosity of 125 mPa·s, 2.5 parts by weight of a silicone oil represented by the formula $(CH_3)_3SiO[(CH_3)_2SiO]_{50}Si(OCH_3)_3$ with a viscosity of 49 mPa·s, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 124 and its thermal conductivity was 6.0 W/m·K.

Example 17

A heat conductive silicone grease with an alumina powder content of 82.8 vol % was prepared by placing 2.5 parts by weight of a silicone oil represented by the formula $(CH_3)_3SiO[(CH_3)_2SiO]_{23}Si(OCH_3)_3$ with a viscosity of 22 mPa·s, 2.5 parts by weight of a silicone oil represented by the formula $(CH_3)_3SiO[(CH_3)_2SiO]_{50}Si(OCH_3)_3$ with a viscosity of 49 mPa·s, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 121 and its thermal conductivity was 6.0 W/m·K.

Example 18

A heat conductive silicone grease with an alumina powder content of 82.8 vol % was prepared by placing 1.66 parts by weight of a silicone oil represented by the formula $(CH_3)_3SiO[(CH_3)_2SiO]_{110}Si(OCH_3)_3$ with a viscosity of 125 mPa·s, 1.66 parts by weight of a silicone oil represented by the formula $(CH_3)_3SiO[(CH_3)_2SiO]_{23}Si(OCH_3)_3$ with a viscosity of 22 mPa·s, 1.66 parts by weight of a silicone oil represented by the formula $(CH_3)_3SiO[(CH_3)_2SiO]_{50}Si(OCH_3)_3$ with a viscosity of 49 mPa·s, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 132 and its thermal conductivity was 6.0 W/m·K.

Example 19

A heat conductive silicone grease with an alumina powder content of 82.8 vol % was prepared by placing 3.33 parts by weight of a silicone oil represented by the formula $(CH_3)_3SiO[(CH_3)_2SiO]_{110}Si(OCH_3)_3$ with a viscosity of 125 mPa·s, 0.83 parts by weight of a silicone oil represented by the formula $(CH_3)_3SiO[(CH_3)_2SiO]_{23}Si(OCH_3)_3$ with a viscosity of 22 mPa·s, 0.83 parts by weight of a silicone oil represented by the formula $(CH_3)_3SiO[(CH_3)_2SiO]_{50}Si(OCH_3)_3$ with a viscosity of 49 mPa·s, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 121 and its thermal conductivity was 6.0 W/m·K.

Example 20

A heat conductive silicone grease with an alumina powder content of 82.8 vol % was prepared by placing 0.83 parts by weight of a silicone oil represented by the formula $(CH_3)_3SiO[(CH_3)_2SiO]O_{110}Si(OCH_3)_3$ with a viscosity of 125 mPa·s, 3.33 parts by weight of a silicone oil represented by the formula $(CH_3)_3SiO[(CH_3)_2SiO]_{23}Si(OCH_3)_3$ with a viscosity of 22 mPa·s, 0.83 parts by weight of a silicone oil represented by the formula $(CH_3)_3SiO[(CH_3)_2SiO]_{50}Si(OCH_3)_3$ with a viscosity of 49 mPa·s, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 125 and its thermal conductivity was 6.0 W/m·K.

Example 21

A heat conductive silicone grease with an alumina powder content of 82.8 vol % was prepared by placing 0.83 parts by weight of a silicone oil represented by the formula $(CH_3)_3SiO[(CH_3)_2SiO]_{110}Si(OCH_3)_3$ with a viscosity of 125 mPa·s, 0.83 parts by weight of a silicone oil represented by the formula $(CH_3)_3SiO[(CH_3)_2SiO]_{23}Si(OCH_3)_3$ with a viscosity of 22 mPa·s, 3.33 parts by weight of a silicone oil represented by the formula $(CH_3)_3SiO[(CH_3)_2SiO]_{50}Si(OCH_3)_3$ with a viscosity of 49 mPa·s, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 128 and its thermal conductivity was 6.0 W/m·K.

Example 22

25.0 parts by weight of a silicone oil represented by the formula $(CH_3)_3SiO[(CH_3)_2SiO]_{110}Si(OCH_3)_3$ with a viscosity of 125 mPa·s and 237.5 parts by weight of a quasi-spherical alumina powder with an average particle size of 10 μm were placed in a mixer and mixed at room temperature, whereupon the same amount of the same alumina powder was again added and combined therewith at room temperature. Subsequently, a heat conductive silicone grease with an alumina powder content of 82.8 vol % was prepared by mixing at room temperature under a reduced pressure of not more than 10 Torr. The ¼-scale cone penetration consistency of the heat conductive silicone grease was 115 and its thermal conductivity was 5.8 W/m·K.

Example 23

25.0 parts by weight of a silicone oil represented by the formula $(CH_2=CH)(CH_3)_2SiO[(CH_3)_2SiO]_{29}Si(OCH_3)_3$ with a viscosity of 24 mPa·s and 237.5 parts by weight of a quasi-spherical alumina powder with an average particle size of 10 μm were placed in a mixer and mixed at room temperature, whereupon the same amount of the same alumina powder was again added and combined therewith at room temperature. Subsequently, a heat conductive silicone grease with an alumina powder content of 82.8 vol % was prepared by mixing at room temperature under a reduced pressure of not more than 10 Torr. The ¼-scale cone penetration consistency of the heat conductive silicone grease was 162 and its thermal conductivity was 4.8 W/m·K.

Example 24

25.0 parts by weight of a silicone oil represented by the formula $(CH_3)_3SiO[(CH_3)_2SiO]_{110}Si(OCH_3)_3$ with a viscosity of 125 mPa·s, 142.5 parts by weight of a spherical alumina powder with an average particle size of 40 μm, and 95 parts by weight of an irregular-shaped alumina powder with an average particle size of 2.2 μm were placed in a mixer and mixed at room temperature, whereupon the same amounts of the same alumina powders were again added and combined therewith at room temperature. Subsequently, a heat conductive silicone grease with an alumina powder content of 82.8 vol % was prepared by mixing at room temperature under a reduced pressure of not more than 10 Torr. The ¼-scale cone penetration consistency of the heat conductive silicone grease was 95 and its thermal conductivity was 5.9 W/m·K.

Example 25

25.0 parts by weight of a silicone oil represented by the formula $(CH_2=CH)(CH_3)_2SiO[(CH_3)_2SiO]_{29}Si(OCH_3)_3$ with a viscosity of 24 mPa·s, 142.5 parts by weight of a spherical alumina powder with an average particle size of 40 μm, and 95 parts by weight of an irregular-shaped alumina powder with an average particle size of 2.2 μm were placed in a mixer and mixed at room temperature, whereupon the same amounts of the same alumina powders were again added and combined therewith at room temperature. Subsequently, a heat conductive silicone grease with an alumina powder content of 82.8 vol % was prepared by mixing at room temperature under a reduced pressure of not more than 10 Torr. The ¼-scale cone penetration consistency of the heat conductive silicone grease was 151 and its thermal conductivity was 5.8 W/m·K.

Example 26

12.5 parts by weight of a silicone oil represented by the formula $(CH_3)_3SiO[(CH_3)_2SiO]_{110}Si(OCH_3)_3$ with a viscosity of 125 mPa·s, 12.5 parts by weight of a silicone oil represented by the formula $(CH_2=CH)(CH_3)_2SiO[(CH_3)_2SiO]_{29}Si(OCH_3)_3$ with a viscosity of 24 mPa·s and 237.5 parts by weight of a quasi-spherical alumina powder with an average particle size of 10 μm were placed in a mixer and mixed at room temperature, whereupon the same amount of the same alumina powder was again added and combined therewith at room temperature. Subsequently, a heat conductive silicone grease with an alumina powder content of 82.8 vol % was prepared by mixing at room temperature under a reduced pressure of not more than 10 Torr. The ¼-scale cone penetration consistency of the heat conductive silicone grease was 128 and its thermal conductivity was 5.1 W/m·K.

Example 27

2.5 parts by weight of a silicone oil represented by the formula $(CH_3)_3SiO[(CH_3)_2SiO]_{110}Si(OCH_3)_3$ with a viscosity of 125 mPa·s, 2.5 parts by weight of a silicone oil represented by the formula $(CH_2=CH)(CH_3)_2SiO[(CH_3)_2SiO]_{29}Si(OCH_3)_3$ with a viscosity of 24 mPa·s, 142.5 parts by weight of a spherical alumina powder with an average particle size of 40 μm, and 95 parts by weight of an irregular-shaped alumina powder with an average particle size of 2.2 μm were placed in a mixer and mixed at room temperature, whereupon the same amounts of the same alumina powders were again added and combined therewith at room temperature. Subsequently, a heat conductive silicone grease with an alumina powder content of 82.8 vol % was prepared by mixing at room temperature under a reduced pressure of not more than 10 Torr. The ¼-scale cone penetration consistency of the heat conductive silicone grease was 143 and its thermal conductivity was 5.9 W/m·K.

Example 28

21.0 parts by weight of a silicone oil represented by the formula $(CH_2=CH)(CH_3)_2SiO[(CH_3)_2SiO]_{29}Si(OCH_3)_3$ with a viscosity of 24 mPa·s, 3.75 parts by weight of a copolymer of methylhydrogensiloxane and dimethylsiloxane having both ends of the molecular chain blocked by dimethylhydrogensiloxy groups and a viscosity of 15 mPa·s (content of silicon-bonded hydrogen atoms=0.13 wt %), and 237.5 parts by weight of a quasi-spherical alumina powder with an average particle size of 10 μm were placed in a mixer and mixed at room temperature, whereupon the same amount of the same alumina powder was again added and combined therewith at room temperature. Subsequently, a heat conductive silicone grease with an alumina powder content of 82.8 vol % was prepared by mixing the mixture at room temperature under a reduced pressure of not more than 10 Torr. The ¼-scale cone penetration consistency of the heat conductive silicone grease was 157 and its thermal conductivity was 5.3 W/m·K.

Example 29

A heat conductive silicone composition was prepared by mixing 0.25 parts by weight of a 1,3-divinyltetramethyldisiloxane complex of platinum with a platinum content of 0.5 wt % with the heat conductive silicone grease prepared in Example 28. A heat conductive silicone grease was prepared by subjecting the composition to a hydrosilylation reaction by heating it at 80° C. for 15 minutes. The ¼-scale cone penetration consistency of the heat conductive silicone grease was 56 and its thermal conductivity was 5.3 W/m·K.

Comparative Example 1

5.0 parts by weight of methyltrimethoxysilane and 95 parts by weight of a quasi-spherical alumina powder with an average particle size of 10 μm were placed in a mixer and mixed at room temperature, but a homogeneous heat conductive silicone grease could not be prepared.

Comparative Example 2

5.0 parts by weight of a silicone oil represented by the formula $(CH_3)_3SiO[(CH_3)_2SiO]_3Si(OCH_3)_3$ with a viscosity of 2.5 mPa·s and 95 parts by weight of a quasi-spherical alumina powder with an average particle size of 10 μm were placed in a mixer and mixed at room temperature, but a homogeneous heat conductive silicone grease could not be prepared.

Comparative Example 3

A heat conductive silicone grease with an alumina powder content of 82.8 vol % was prepared by placing 5.0 parts by weight of decyltrimethoxysilane, 57 parts by weight of a spherical alumina powder with an average particle size of 40 μm, and 38 parts by weight of an irregular-shaped alumina powder with an average particle size of 2.2 μm in a mixer and mixing the components at room temperature. The ¼-scale cone penetration consistency of the heat conductive silicone grease was 50.

INDUSTRIAL APPLICABILITY

The heat conductive silicone composition has excellent handing properties despite containing a large amount of heat conductive filler used to obtain a highly heat conductive silicone composition.

The invention claimed is:

1. A composition comprising:
   (A) a silicone oil, and
   (B) a heat conductive filler,
   with the provisos that component (A) is selected from the group consisting of silicone oils described by a general formula $(A_1)$; silicone oils described by a general formula $(A_3)$; mixtures of formulae $(A_1)$ and $(A_3)$; and hydrosilylation reaction mixtures of formula $(A_1)$ and formula $(A_3)$, where formula $(A_1)$ is $[R^1_a R^2_{(3-a)}SiO(R^1_b R^2_{(2-b)}SiO)_m(R^2_2SiO)_n]_c SiR^2_{[4-(c+d)]}(OR^3)_d$, and formula $(A_3)$ is $[H_e R^2_{(3-e)}SiO(R^2_2SiO)_n]_e SiR^2_{[4-(e+d)]}(OR^3)_d$ where all instances of $R^1$ are identical or different monovalent hydrocarbon groups with aliphatically unsaturated bonds, all instances of $R^2$ are identical or different monovalent hydrocarbon groups that do not have aliphatically unsaturated bonds, $R^3$ stands for alkyl, alkoxyalkyl, alkenyl, or acyl, "a" is an integer of 0 to 3, "b" is 1 or 2, "c" is an integer of 1 to 3, "d" is an integer of 1 to 3, "c+d" is an integer of 2 to 4, "m" is an integer of 0 or greater, "n" is an integer of 15 to 100, with the proviso that "m" is 1 or greater when "a" is 0, and "e" is an integer of 1 to 3, and component (B) is surface treated with component (A), and where a content of component (B) is 500 to 3,500 parts by weight per 100 parts by weight of component (A).

2. The composition of claim 1, where component (B) is an alumina powder.

3. The composition of claim 1, where component (B) is selected from component $(B_1)$ or component $(B_2)$, where
   $(B_1)$ is a quasi-spherical alumina powder with an average particle size of 0.1 to 20 μm;
   $(B_2)$ is a mixture of $(B_{21})$ and $(B_{22})$, where
   $(B_{21})$ is a quasi-spherical alumina powder with an average particle size of greater than 5 to 50 μm, and
   $(B_{22})$ is a quasi-spherical or irregular-shaped alumina powder with an average particle size of 0.1 to 5 μm.

4. The composition of claim 3, where component $(B_2)$ is 30 to 90 wt% of component $(B_{21})$ and 10 to 70 wt% of component $(B_{22})$.

5. The composition of claim 1, where component (A) is a silicone oil selected from the group consisting of formula $(A_1)$ and formula $(A_3)$, and the composition further comprises (C) a component increasing the viscosity of component (A) via a hydrosilylation reaction, with the proviso that component (C) does not contain silicone oils corresponding to component (A).

* * * * *

UNITED STATES PATENT AND TRADEMARK OFFICE
CERTIFICATE OF CORRECTION

PATENT NO.       : 7,592,383 B2                                          Page 1 of 1
APPLICATION NO. : 10/533849
DATED            : September 22, 2009
INVENTOR(S)      : Hiroshi Fukui It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 541 days.

Signed and Sealed this

Twenty-first Day of September, 2010

David J. Kappos
*Director of the United States Patent and Trademark Office*